(12) United States Patent
Nagasaki et al.

(10) Patent No.: US 7,358,105 B2
(45) Date of Patent: Apr. 15, 2008

(54) SOLID-STATE IMAGING DEVICE, METHOD FOR MANUFACTURING THE SAME AND INTERLINE TRANSFER CCD IMAGE SENSOR

(75) Inventors: Hiroki Nagasaki, Kyoto (JP); Syouji Tanaka, Ikoma (JP); Yoshiyuki Matsunaga, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 31 days.

(21) Appl. No.: 11/292,835

(22) Filed: Dec. 2, 2005

(65) Prior Publication Data
US 2006/0076582 A1   Apr. 13, 2006

Related U.S. Application Data

(62) Division of application No. 10/742,419, filed on Dec. 19, 2003, now Pat. No. 7,157,754.

(30) Foreign Application Priority Data
Mar. 3, 2003   (JP) .............. 2003-056224

(51) Int. Cl.
*H01L 21/00* (2006.01)
(52) U.S. Cl. .............. 438/48; 438/75; 257/291; 257/292; 257/E27.133
(58) Field of Classification Search .......... 257/291, 257/292, E27.133; 438/48, 75
See application file for complete search history.

(56) References Cited

U.S. PATENT DOCUMENTS 5,576,562 A * 11/1996 Konuma .............. 257/232
5,770,504 A * 6/1998 Brown et al. .............. 438/296
6,144,086 A * 11/2000 Brown et al. .............. 257/510
6,177,333 B1 * 1/2001 Rhodes .............. 438/433
6,294,419 B1 * 9/2001 Brown et al. .............. 438/221
6,403,998 B1   6/2002 Inoue
6,483,163 B2   11/2002 Isogai et al.
2001/0025970 A1  10/2001 Nozaki et al.

FOREIGN PATENT DOCUMENTS

| JP | 11-87684 | 3/1999 |
| JP | 2000-150848 A | 5/2000 |
| JP | 2001-345439 | 12/2001 |
| JP | 2002-57319 A | 2/2002 |
| KR | 2003-0001797 | 1/2003 |

* cited by examiner

*Primary Examiner*—Andy Huynh
(74) *Attorney, Agent, or Firm*—Hamre, Schumann, Mueller & Larson, P.C.

(57) ABSTRACT

A high-performance solid-state imaging device is provided. The solid-state imaging device includes: a plurality of pixel cells; and a driving unit. Each of the plurality of pixel cells includes: a photodiode that converts incident light into a signal charge and stores the signal charge; a MOS transistor that is provided for reading out the signal charge stored in the photodiode; an element isolation portion that is formed of a STI that is a grooved portion of the semiconductor substrate so that the photodiode and the MOS transistor are isolated from each other; and a deep-portion isolation implantation layer that is formed under the element isolation portion for preventing a flow of a charge from the photodiode to the MOS transistor.

13 Claims, 10 Drawing Sheets

SOLID-STATE IMAGING DEVICE, METHOD FOR MANUFACTURING THE SAME AND INTERLINE TRANSFER CCD IMAGE SENSOR

This application is a divisional of application Ser. No. 10/742,419, filed Dec. 19, 2003, which application is incorporated herein by reference.

BACKGROUND OF THE INVENTION

1. Field of the Invention

The present invention relates to a solid-state imaging device provided with an element isolation portion formed of a STI (Shallow Trench Isolation) that is a grooved portion of a semiconductor substrate and a method for manufacturing the same and relates to an interline transfer CCD image sensor.

2. Related Background Art

In recent years, attention has been drawn to a solid-state imaging device provided with an amplification-type MOS transistor. In this solid-state imaging device, for each pixel, a signal detected by a photodiode is amplified by a MOS transistor, and the device has a feature of high sensitivity.

Figure 6:
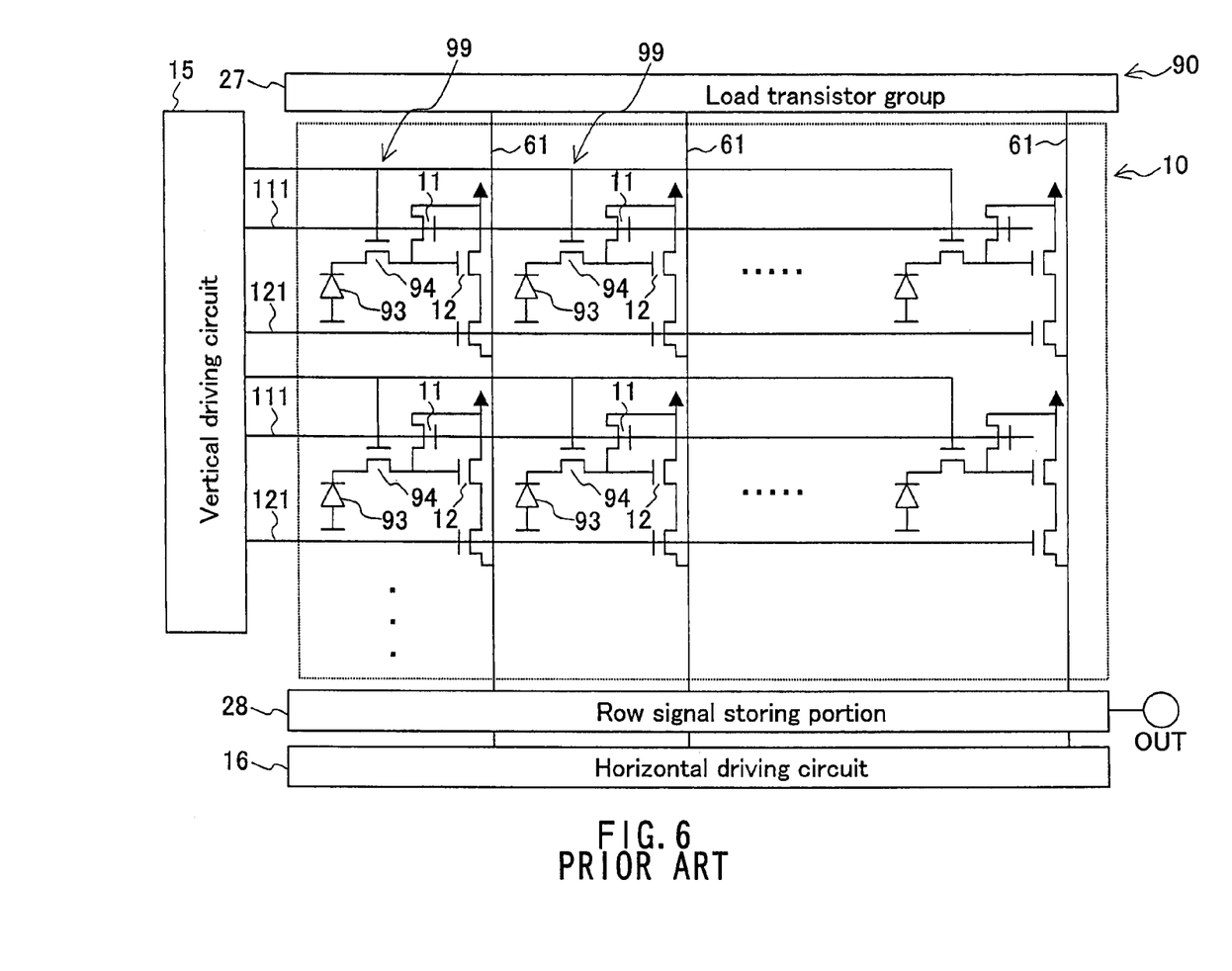
FIG. 6 is a circuit diagram showing a configuration of the conventional solid-state imaging device.

FIG. 6 is a circuit diagram showing a configuration of a conventional solid-state imaging device 90. The solid-state imaging device 90 includes a plurality of pixel cells 99 arranged in a matrix form on a semiconductor substrate 10. Each of the pixel cells 99 includes a photodiode 93 that converts incident light into a signal charge and stores the signal charge. In each of the pixel cells 99, a transfer transistor 94 for reading out the signal charge stored in the photodiode 93 is provided.

Each of the pixel cells 99 includes an amplify transistor 12. The amplify transistor 12 amplifies the signal charge read out by the transfer transistor 94. In each of the pixel cells 99, a reset transistor 11 is provided. The reset transistor 11 resets the signal charge read out by the transfer transistor 94.

The solid-state imaging device 90 includes a vertical driving circuit 15. A plurality of reset transistor control lines 111 are connected to the vertical driving circuit 15. The reset transistor control lines 111 are arranged parallel with each other at predetermined intervals and along a horizontal direction so as to be connected to the reset transistors 11 that are respectively provided in the pixel cells 99 arranged along the horizontal direction. A plurality of vertical select transistor control lines 121 further are connected to the vertical driving circuit 15. The vertical select transistor control lines 121 are arranged parallel with each other at predetermined intervals and along the horizontal direction so as to be connected to vertical select transistors that are provided respectively in the pixel cells 99 arranged along the horizontal direction. The vertical select transistor control lines 121 determine a row from which a signal is to be read out.

A source of each vertical select transistor is connected to a vertical signal line 61. A load transistor group 27 is connected to one end of each vertical signal line 61. The other end of each vertical signal line 61 is connected to a row signal storing portion 28. The row signal storing portion 28 includes a switching transistor for capturing signals from one row. A horizontal driving circuit 16 is connected to the row signal storing portion 28.

Figure 7:
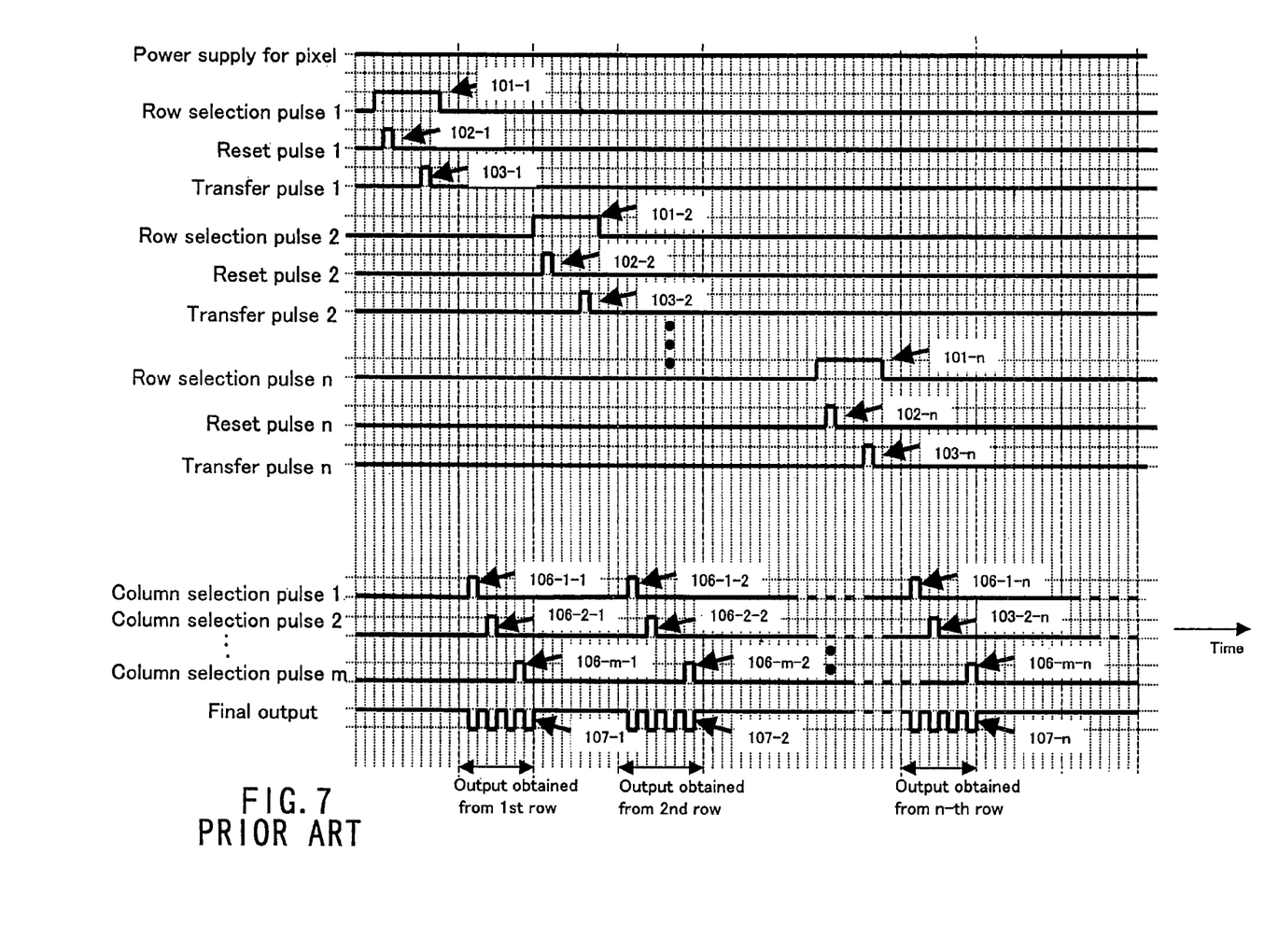
FIG. 7 is a timing chart for explaining an operation of the conventional solid-state imaging device.

FIG. 7 is a timing chart for explaining an operation of the conventional solid-state imaging device 90.

When a row selection pulse 101-1 is applied so as to make a level of a vertical select transistor control line 121 high, the vertical select transistors in the selected row turn ON, so that the amplify transistors 12 in the selected row and the load transistor group 27 form a source follower circuit.

While the row selection pulse 101-1 is at a high level, a reset pulse 102-1 for making a reset transistor control line 111 at a high level is applied so as to reset a potential of a floating diffusion layer to which a gate of each of the amplify transistors 12 is connected. Next, while the row selection pulse 101-1 is at the high level, a transfer pulse 103-1 is applied so as to make a level of transfer transistor control lines high, which allows a signal charge stored in each of the photodiodes 93 to be transferred to the floating diffusion layer.

At this time, each of the amplify transistors 12 connected to the floating diffusion layer has a gate voltage equal to the potential of the floating diffusion layer, which allows a voltage that is substantially equal to this gate voltage to appear across the vertical signal line 61. Then, a signal based on the signal charge stored in the photodiode 93 is transferred to the row signal storing portion 28.

Next, the horizontal driving circuit 16 sequentially generates column selection pulses 106-1-1, 106-1-2, . . . so as to extract the signals that have been transferred to the row signal storing portion 28 as an output signal 107-1 corresponding to those obtained from one row.

Figure 8:
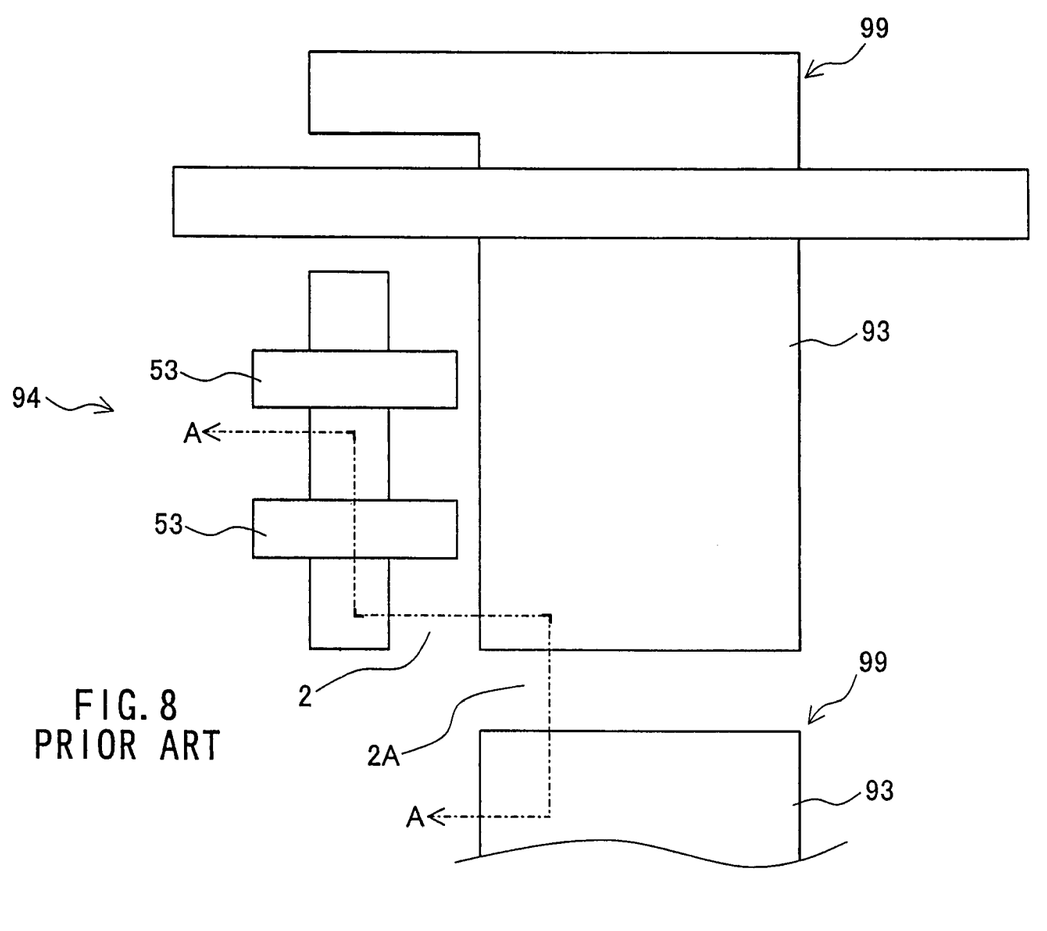
FIG. 8 is a plan view for explaining a configuration of a photodiode and a MOS transistor that are provided in the conventional solid-state imaging device.
Figure 9:
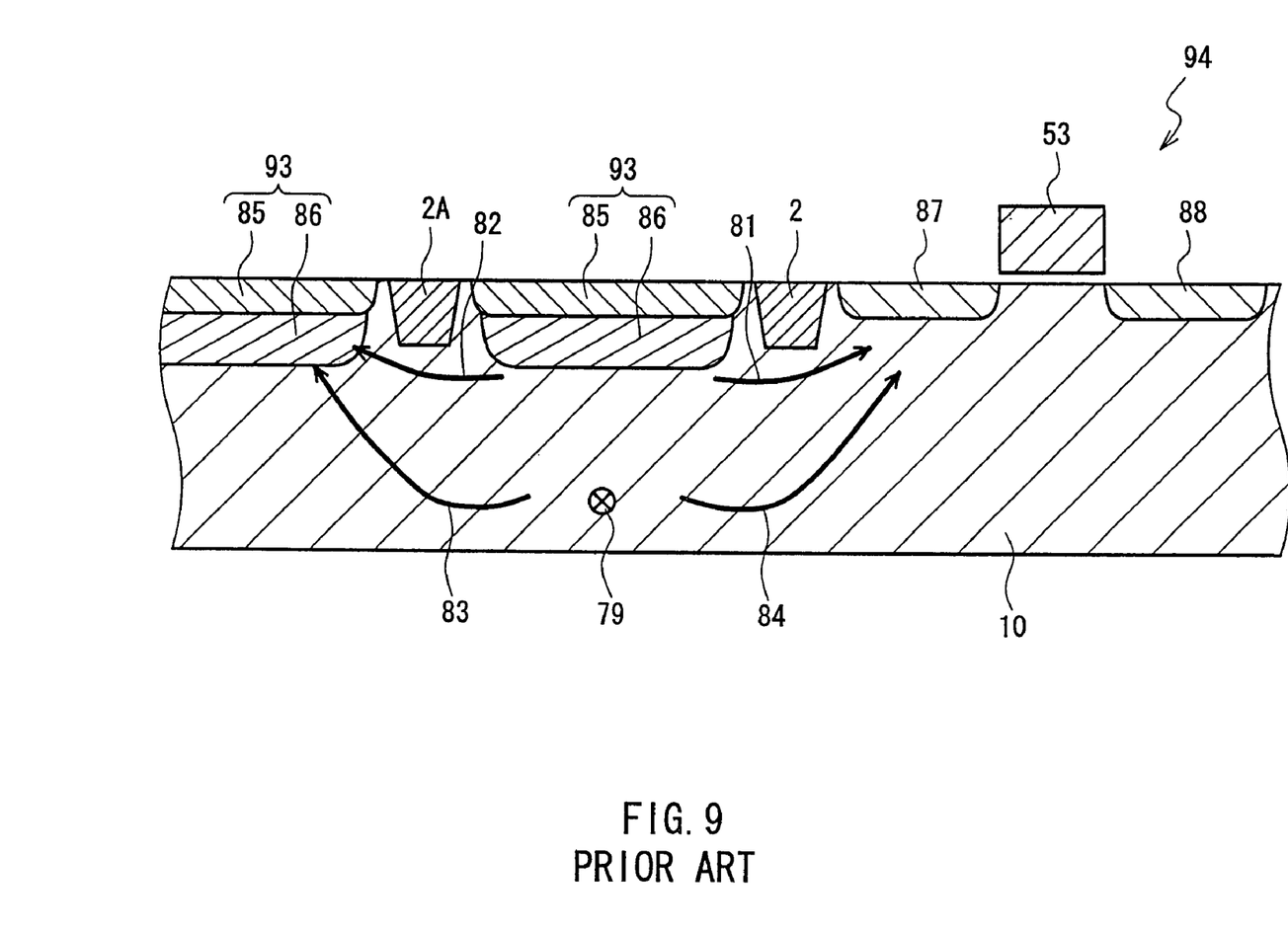
FIG. 9 is a cross-sectional view taken along a line AA shown in FIG. 8.

FIG. 8 is a plan view for explaining a configuration of the photodiode 93 and the transfer transistor 94 that are provided in the conventional solid-state imaging device 90. FIG. 9 is a cross-sectional view taken along a line AA shown in FIG. 8.

The photodiode 93 is a buried-type pnp photodiode that includes a surface shield layer 85 formed at a surface of a semiconductor substrate 10 and a storage photodiode layer 86 formed below the surface shield layer 85. The surface shield layer 85 has a conductivity type opposite to that of the semiconductor substrate 10 and the storage photodiode layer 86 has the same conductivity type as that of the semiconductor substrate 10. The storage photodiode layer 86 is formed at a position of about 1 μm in depth.

The transfer transistor 94 is formed adjacent to the photodiode 93 and includes a gate electrode 53 formed on the semiconductor substrate 10 and a source 87 and a drain 88 formed on each side of the gate electrode 53.

In recent years, the microfabrication of transistors has rapidly progressed. Following this, depths of the source 87 and the drain 88 have been rapidly made shallower, which are currently about 0.1 μm.

Between the photodiode 93 and the transfer transistor 94, an element isolation portion 2 formed of a STI (Shallow Trench Isolation), which is a grooved portion of the semiconductor substrate 10 is formed so that the photodiode 93 and the transfer transistor 94 are isolated from each other.

An element isolation portion 2A is formed so that the photodiode 93 is isolated from another photodiode 93 contained in a pixel cell 99 adjacent to the pixel cell 99 containing the photodiode 93.

The element isolation portion 2 and the element isolation portion 2A are formed at up to a depth of about 300 nm. As the microfabrication of transistors proceeds, the element isolation portion 2 and the element isolation portion 2A are increasingly made shallower. This is because as the microfabrication proceeds, the width of the element isolation portion becomes narrower rapidly, and if the element isolation portion is grooved deeply, its aspect ratio becomes large, which makes it impossible to fill an oxidation film in that portion.

In this way, the storage photodiode layer 86 of the photodiode 93 is formed at a position deeper than the element isolation portion 2 and the element isolation portion 2A.

Figure 10:
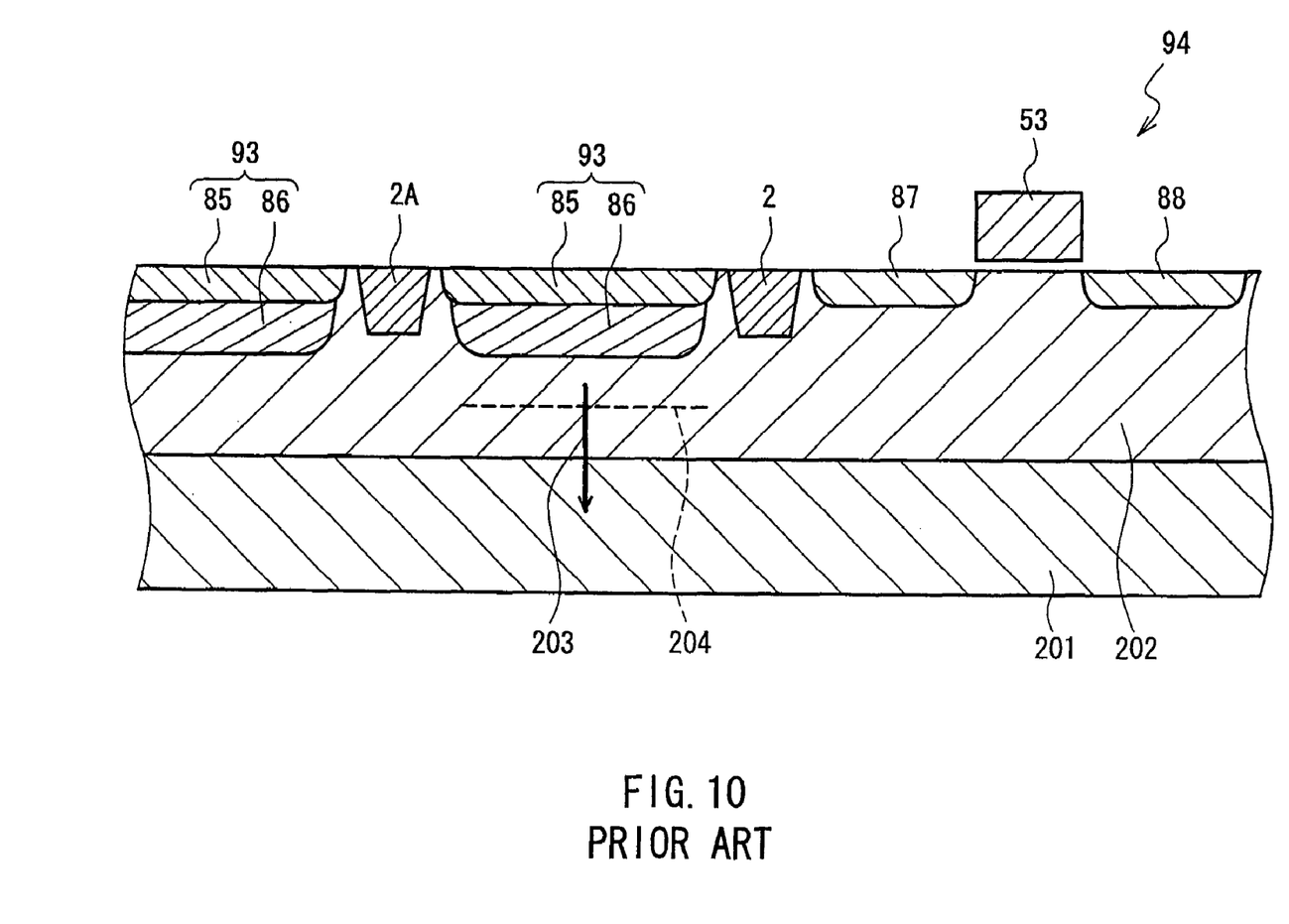
FIG. 10 is a cross-sectional view taken along a line AA shown in FIG. 8 for explaining a configuration of a photodiode and a MOS transistor that are provided in another conventional solid-state imaging device.

FIG. 10 is a cross-sectional view along the line AA shown in FIG. 8 for explaining configurations of a photodiode and a MOS transistor that are provided in another conventional solid-state imaging device. The same reference numerals are assigned to the elements having the same configurations as those of the elements described with reference to FIG. 9, and therefore detailed explanations for these elements will be omitted.

A p-type well 202 is formed on an n-type semiconductor substrate 201. A depth of an interface between the n-type semiconductor substrate 201 and the p-type well 202 is set at about 2.8 μm. A density of the n-type semiconductor substrate 201 is set at about $2\times10^{14}$ cm$^{-3}$ and a density of the p-type well 202 is set at about $1\times10^{15}$ cm$^{-3}$.

A charge stored in the photodiode 93 is discharged directly to the semiconductor substrate 201 as indicated by an arrow 203. This well structure can prevent a charge occurring at a deeper portion of the substrate also from reaching to the photodiode 93 and to the transfer transistor 94.

In the above-described configuration shown in FIG. 9, however, when the photodiode 93 converts incident light into a signal charge so as to let the storage photodiode layer 86 store the signal change, the signal charge stored in the storage photodiode layer 86 flows beyond the element isolation portion 2 and into the source 87 of the transfer transistor 94 as indicated by an arrow 81. As a result, there is a problem that a saturation charge capacity of the photodiode 93 decreases.

In addition, the signal charge stored in the storage photodiode layer 86 flows beyond the element isolation portion 2A and into the adjacent photodiode 93 as indicated by an arrow 82. As a result, there is a problem of a phenomenon called color mixture, which degrades the reproducibility of colors by the imaging device.

Furthermore, when a signal charge 79 that occurs at a deeper portion of the semiconductor substrate 10 due to the incident light enters into the adjacent photodiode 93 as indicated by an arrow 83 or enters into the source 87 of the adjacent transistor 94 as indicated by an arrow 84, the color mixture or the deterioration of sensitivity would occur.

Also with the configuration shown in FIG. 10, there occur inevitable problems of a deterioration of the saturation charge capacity of the photodiode, the color mixture and the deterioration of sensitivity.

A divide 204 is formed at a position of about 1.8 μm in depth that is around the midpoint between the lower end of the p-type well 202 and the lower end of the storage photodiode layer 86. Although a charge occurring at a position shallower than the divide 204 arrives at the photodiode 93, a charge occurring at a position deeper than the divide 204 does not arrive at the photodiode 93, which degrades the sensitivity.

Note here that the divide 204 represents a virtual border line between an electron flowing on a surface side due to thermal diffusion in terms of probabilities and an electron flowing through a deep portion of the substrate.

The following describes more details of the above-stated discharge to the semiconductor substrate 201. When a charge is discharged from the photodiode 93 to the semiconductor substrate 201, a depletion layer that extends from a side of the photodiode 93 toward the semiconductor substrate 201 through the p-type well 202 and a depletion layer that extends from the n-type semiconductor substrate 201 toward the photodiode 93 through the p-type well 202 contact with each other at the divide 204.

In this case, a charge overflowing the saturated photodiode 93 passes through the depletion layer to which an electric field is applied, and therefore the charge is discharged along the electric field to the n-type semiconductor substrate 201 without moving randomly. This is the same operation as in a well-known interline transfer type vertical overflow drain structure in which each pixel cell unit has a photodiode and a vertical CCD. Such a discharge method is called a junction FET mode.

SUMMARY OF THE INVENTION

Therefore, with the foregoing in mind, it is an object of the present invention to provide a high-performance solid-state imaging device, a method for manufacturing the same and an interline transfer CCD image sensor.

A solid-state imaging device according to the present invention includes: a plurality of pixel cells arranged in a matrix form on a semiconductor substrate; and a driving unit that is provided for driving the plurality of pixel cells. Each of the plurality of pixel cells includes: a photodiode that converts incident light into a signal charge and stores the signal charge; at least one MOS transistor that is provided for reading out the signal charge stored in the photodiode; an element isolation portion, which is formed of a STI (Shallow Trench Isolation) that is a grooved portion of the semiconductor substrate so that the photodiode and the MOS transistor are isolated from each other; and a deep-portion isolation implantation layer that is formed under the element isolation portion for preventing a flow of a charge from the photodiode to the MOS transistor.

Another solid-state imaging device according to the present invention includes: a plurality of pixel cells arranged in a matrix form on a semiconductor substrate; and a driving unit that is provided for driving the plurality of pixel cells. Each of the plurality of pixel cells includes: a photodiode that converts incident light into a signal charge and stores the signal charge; at least one MOS transistor that is provided for reading out the signal charge stored in the photodiode; an element isolation portion that is formed of a STI (Shallow Trench Isolation), which is a grooved portion of the semiconductor substrate so that the photodiode and another photodiode included in a pixel cell adjacent to the pixel cell including the photodiode are isolated from each other; and a deep-portion isolation implantation layer that is formed under the element isolation portion for preventing a flow of a charge from the photodiode to another photodiode included in a pixel cell adjacent to the pixel cell including the photodiode.

A solid-state imaging device manufacturing method according to the present invention is for manufacturing the solid-state imaging device according to the present invention and includes the steps of: grooving the semiconductor substrate so as to form a groove for the formation of the element isolation portion; implanting an impurity from a bottom of the groove so as to form the deep-portion isolation implantation layer for preventing a flow of a charge from the photodiode to the MOS transistor; forming the element isolation portion in the groove after the impurity implantation step; and forming the photodiode and the at least one MOS transistor after the element isolation portion formation step.

An interline transfer CCD image sensor according to the present invention includes: a plurality of pixel cells arranged in a matrix form on a semiconductor substrate; and a driving unit that is provided for driving the plurality of pixel cells. Each of the plurality of pixel cells includes: a photodiode that converts incident light into a signal charge and stores the signal charge; a transfer gate that is provided for reading out the signal charge stored in the photodiode; an element isolation portion, which is formed of a STI (Shallow Trench Isolation) that is a grooved portion of the semiconductor substrate so that the photodiode and the transfer gate are isolated from each other; vertical transfer CCDs that are arranged at predetermined intervals and along a vertical direction so as to be adjacent to the respective pixel cells that are arranged along a column direction, the vertical transfer CCDs being provided for transferring the signal charge read out from the photodiode by the transfer gate along the vertical direction; and a deep-portion isolation implantation layer that is formed under the element isolation portion for preventing a flow of a charge from the photodiode to the transfer gate.

DETAILED DESCRIPTION OF THE INVENTION

In the solid-state imaging device according to the present embodiment, the deep-portion isolation implantation layer is formed under the element isolation portion for preventing a flow of a charge from the photodiode to the MOS transistor. Therefore, the flow of a charge from the photodiode to the MOS transistor can be prevented. As a result, a solid-state imaging device with a favorable sensitivity can be obtained.

In this embodiment, it is preferable that the MOS transistor includes a source and a drain that are formed in the semiconductor substrate, and an impurity having a conductivity type opposite to a conductivity type of the source and the drain of the MOS transistor is implanted into the deep-portion isolation implantation layer.

It is preferable that the element isolation portion is formed so that the photodiode is isolated from another photodiode included in a pixel cell adjacent to the pixel cell including the photodiode, and the deep-portion isolation implantation layer is formed so as to prevent a flow of a charge from the photodiode to another photodiode included in a pixel cell adjacent to the pixel cell including the photodiode.

It is preferable that the deep-portion isolation implantation layer is formed to a position deeper than the photodiode.

It is preferable that the deep-portion isolation implantation layer is formed at a position from about 0.3 μm to about 1.0 μm in depth from a surface of the semiconductor substrate.

It is preferable that the photodiode includes: a surface shield layer that is formed at a surface of the semiconductor substrate; and a storage photodiode layer that is formed under the surface shield layer, wherein a density of the deep-portion isolation implantation layer is larger than a density of the storage photodiode layer.

It is preferable that the at least one MOS transistor is at least one n-type MOS transistor.

It is preferable that the semiconductor substrate includes: a first p-type well that is formed so as to enclose the photodiode, the element isolation portion and side faces and a bottom face of the deep-portion isolation implantation layer; and a second p-type well that is formed under the first p-type well and has an impurity density higher than an impurity density of the first p-type well.

It is preferable that the deep-portion isolation implantation layer is formed so as to contact with the second p-type well.

It is preferable that an impurity density of the deep-portion isolation implantation layer is larger than the impurity density of the second p-type well.

It is preferable that the driving unit includes: a vertical driving circuit for driving the plurality of pixel cells along a row direction; and a horizontal driving circuit for driving the plurality of pixel cells along a column direction.

In another solid-state imaging device according to this embodiment, the deep-portion isolation implantation layer is formed under the element isolation portion for preventing a flow of a charge from the photodiode to another photodiode included in a pixel cell adjacent to the pixel cell including the photodiode. Therefore, the flow of a charge from the photodiode to another photodiode included in a pixel cell adjacent to the pixel cell including the photodiode can be prevented. As a result, a solid-state imaging device with a favorable sensitivity can be obtained.

In the method for manufacturing a solid-state imaging device according to this embodiment, an impurity is implanted from a bottom of the groove so as to form the deep-portion isolation implantation layer for preventing a flow of a charge from the photodiode to the MOS transistor. Therefore, the thus formed deep-portion isolation implantation layer can prevent the flow of a charge from the photodiode to the MOS transistor. As a result, a solid-state imaging device with a favorable sensitivity can be manufactured.

In the interline transfer CCD image sensor according to this embodiment, the deep-portion isolation implantation layer is formed under the element isolation portion for preventing a flow of a charge from the photodiode to the transfer gate. Therefore, the flow of a charge from the photodiode to the transfer gate can be prevented. As a result, an interline transfer CCD image sensor with a favorable sensitivity can be obtained.

In this embodiment, it is preferable that the semiconductor substrate includes: a first p-type well that is formed so as to enclose the photodiode, the element isolation portion and side faces and a bottom face of the deep-portion isolation implantation layer; and a second p-type well that is formed under the first p-type well and has an impurity density higher than an impurity density of the first p-type well.

It is preferable that the deep-portion isolation implantation layer is formed so as to contact with the second p-type well.

It is preferable that an impurity density of the deep-portion isolation implantation layer is larger than the impurity density of the second p-type well.

The following describes an embodiment of the present invention, with reference to the drawings.

Figure 1:
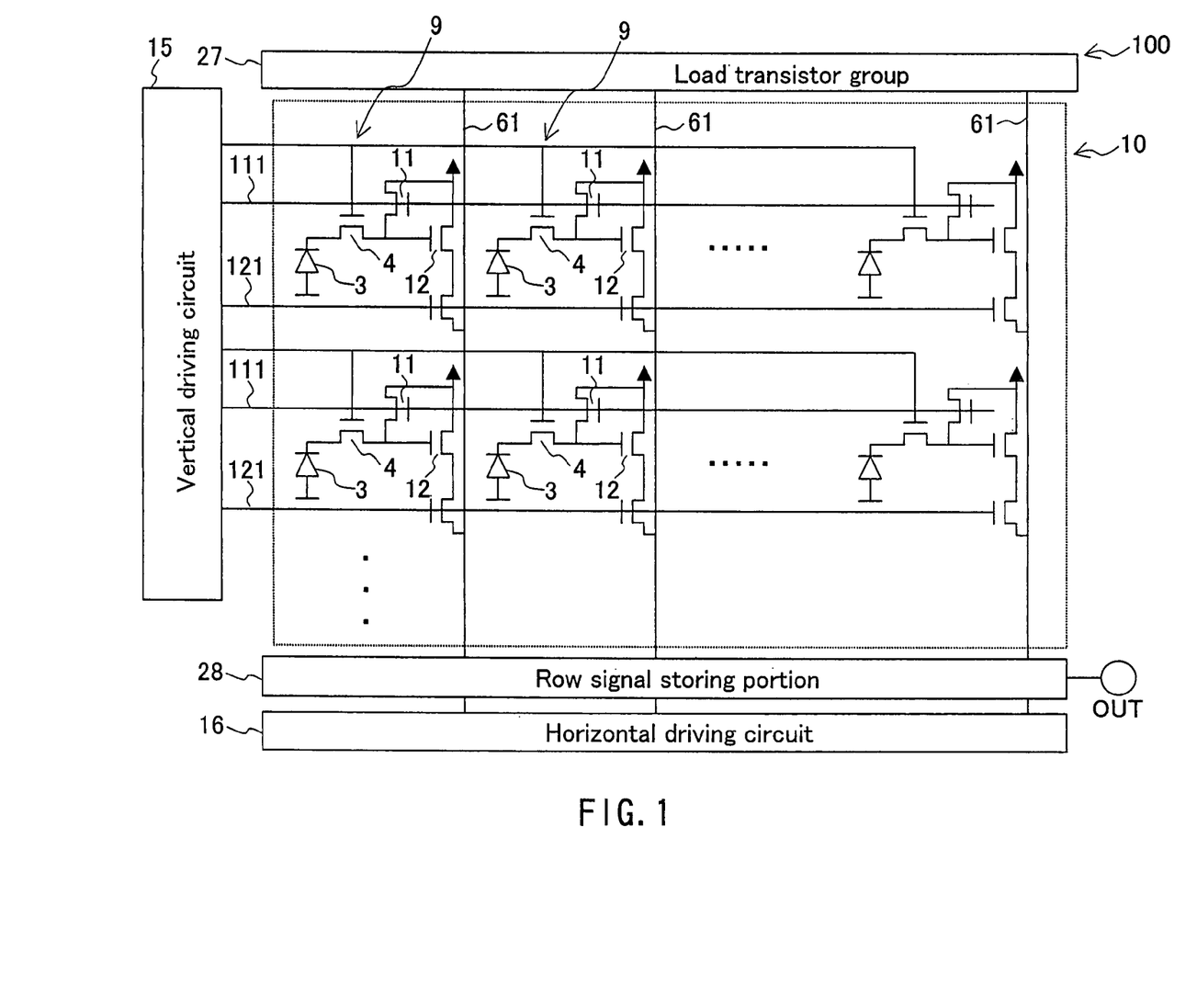
FIG. 1 is a circuit diagram showing a configuration of a solid-state imaging device according to the present embodiment.

FIG. 1 is a circuit diagram showing a configuration of a solid-state imaging device 100 according to this embodiment.

The solid-state imaging device 100 includes a plurality of pixel cells 9 that are arranged in a matrix form on a semiconductor substrate 10. Each of the pixel cells 9 includes a photodiode 3 that converts incident light into a signal charge and stores the signal charge. In each of the pixel cells 9, a transfer transistor 4 for reading out the signal charge stored in the photodiode 3 is provided.

Each of the pixel cells 9 includes an amplify transistor 12. The amplify transistor 12 amplifies the signal charge read out by the transfer transistor 4. In each of the pixel cells 9, a reset transistor 11 is provided. The reset transistor 11 resets the signal charge read out by the transfer transistor 4.

The solid-state imaging device 100 includes a vertical driving circuit 15. A plurality of reset transistor control lines 111 are connected to the vertical driving circuit 15. The reset transistor control lines 111 are arranged parallel with each other at predetermined intervals and along a horizontal direction so as to be connected to the reset transistors 11 that are respectively provided in the pixel cells 9 arranged along the horizontal direction. A plurality of vertical select transistor control lines 121 further are connected to the vertical driving circuit 15. The vertical select transistor control lines 121 are arranged parallel with each other at predetermined intervals and along the horizontal direction so as to be connected to vertical select transistors that are provided respectively in the pixel cells 9 arranged along the horizontal direction. The vertical select transistor control lines 121 determine a row from which a signal is to be read out.

A source of each vertical select transistor is connected to a vertical signal line 61. A load transistor group 27 is connected to one end of each vertical signal line 61. The other end of each vertical signal line 61 is connected to a row signal storing portion 28. The row signal storing portion 28 includes a switching transistor for capturing signals from one row. A horizontal driving circuit 16 is connected to the row signal storing portion 28.

Figure 2:
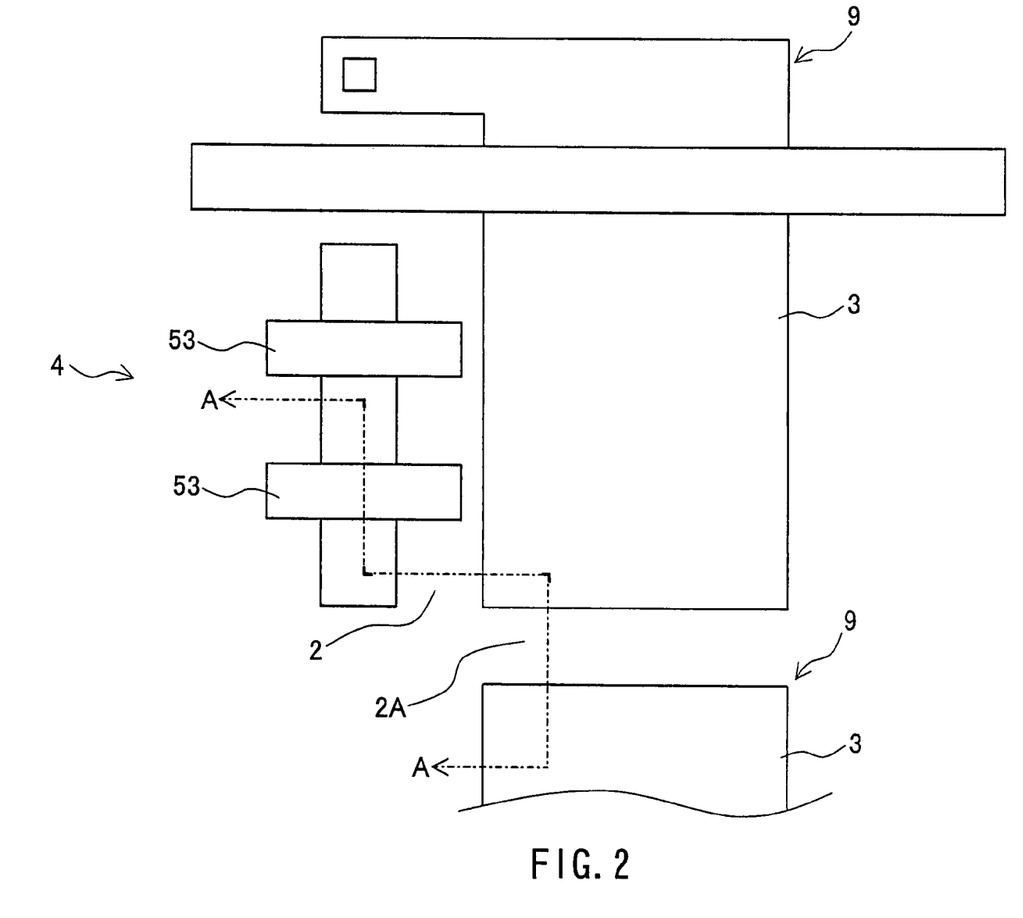
FIG. 2 is a plan view for explaining a configuration of a photodiode and a MOS transistor that are provided in the solid-state imaging device according to this embodiment.
Figure 3:
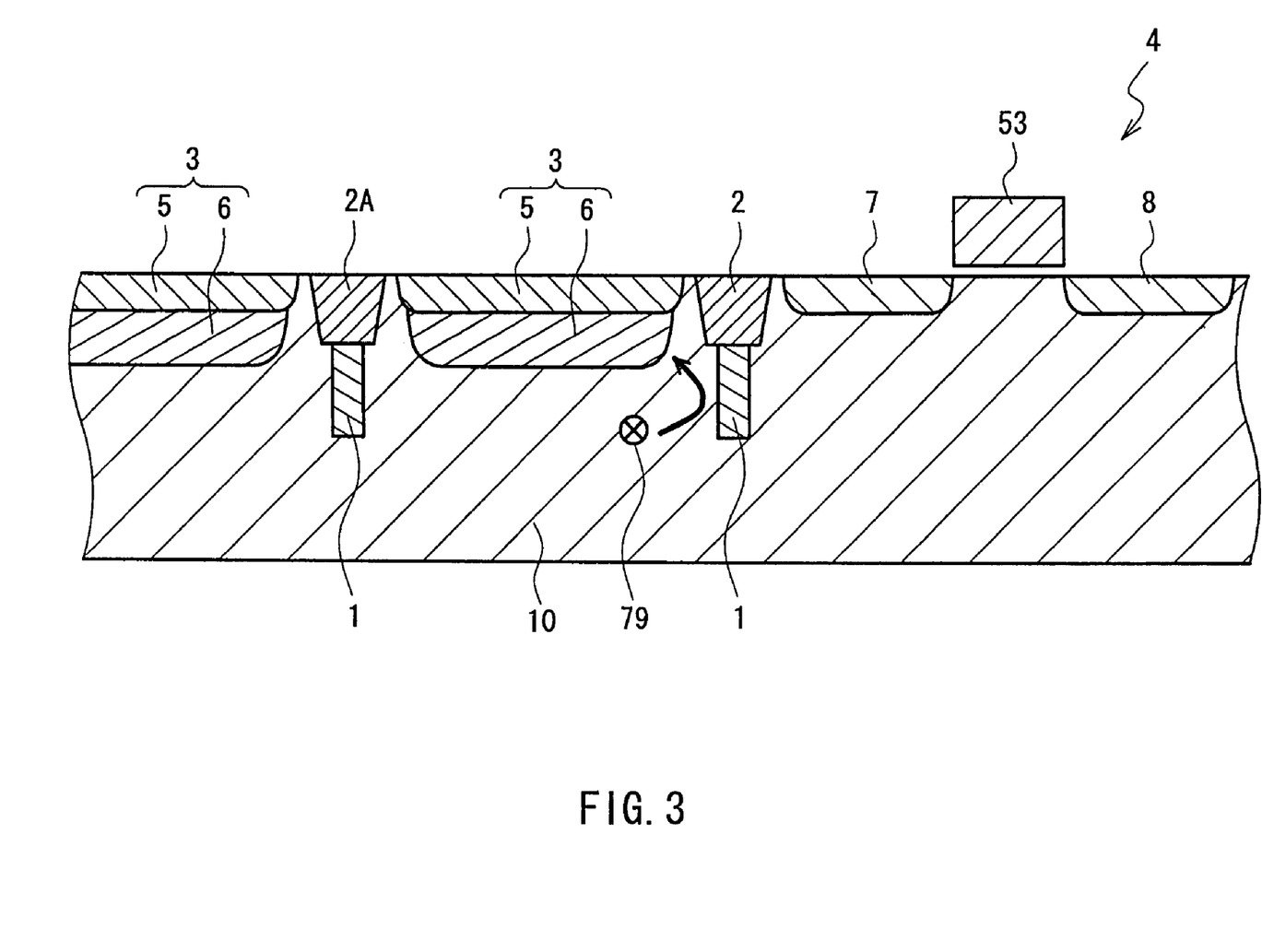
FIG. 3 is a cross-sectional view taken along a line AA shown in FIG. 2.

FIG. 2 is a plan view for explaining a configuration of the photodiode 3 and the transfer transistor 4 that are provided in the solid-state imaging device 100 according to this embodiment. FIG. 3 is a cross-sectional view taken along a line AA shown in FIG. 2.

The photodiode 3 is a buried-type pnp photodiode that includes a surface shield layer 5 formed at a surface of a semiconductor substrate 10 and a storage photodiode layer 6 formed below the surface shield layer 5. The surface shield layer 5 has a conductivity type opposite to that of the semiconductor substrate 10 and the storage photodiode layer 6 has the same conductivity type as that of the semiconductor substrate 10. The surface shield layer 5 is formed at up to a position of about 0.2 μm in depth and the storage photodiode layer 6 is formed at up to a position of about 0.8 μm in depth.

The transfer transistor 4 is formed adjacent to the photodiode 3 and includes a gate electrode 53 formed on the semiconductor substrate 10 and a source 7 and a drain 8 formed on each side of the gate electrode 53.

In recent years, the microfabrication of transistors has rapidly progressed. Following this, depths of the source 7 and the drain 8 rapidly have been made shallower, which are currently about 0.1 μm.

Between the photodiode 3 and the transfer transistor 4, an element isolation portion 2 formed of a STI (Shallow Trench Isolation) that is a grooved portion of the semiconductor substrate 10 is formed so that the photodiode 3 and the transfer transistor 4 are isolated from each other.

An element isolation portion 2A is formed so that the photodiode 3 is isolated from another photodiode 3 contained in a pixel cell 9 adjacent to the pixel cell 9 containing the photodiode 3.

The element isolation portion 2 and the element isolation portion 2A are formed at up to a depth of about 300 nm. As the microfabrication of transistors proceeds, the element isolation portion 2 and the element isolation portion 2A are increasingly made shallower. This is because as the microfabrication proceeds, the width of the element isolation portion becomes narrower rapidly, and if the element isolation portion is grooved deeply, its aspect ratio becomes large, which makes it impossible to fill an oxidation film in that portion.

Under the element isolation portion 2 and the element isolation portion 2A, deep-portion isolation implantation layers 1 respectively are formed along a direction perpendicular to a surface of the semiconductor substrate 10. The deep-portion isolation implantation layers 1 respectively are formed for preventing the flow of a charge from the photodiode 3 to the transfer transistor 4 and for preventing the flow of a charge from the photodiode 3 to another photodiode 3 included in a pixel cell 9 adjacent to the pixel cell 9 including the photodiode 3.

An impurity having a conductivity type opposite to that of the source 7 and the drain 8 of the transfer transistor 4 is implanted into the deep-portion isolation implantation layers 1. The deep-portion isolation implantation layers 1 are formed at positions from about 0.3 μm to about 1.0 μm in depth from the surface of the semiconductor substrate 10. In this way, the deep-portion isolation implantation layers 1 are formed to positions deeper than the storage photodiode layer 6 of the photodiode 3.

An implantation density of the deep-portion isolation implantation layers 1 is set at $1 \times 10^{16}$ cm$^{-3}$ or more. A density of the surface shield layer 5 of the photodiode 3 is set at about $1 \times 10^{19}$ cm$^{-3}$ and a density of the storage photodiode layer 6 is set at about $1 \times 10^{17}$ cm$^{-3}$. A density of the semiconductor substrate is set at $1 \times 10^{15}$ cm$^{-3}$. In this way, the density of the deep-portion isolation implantation layers 1 is set larger than the density of the storage photodiode layer 6.

A method for manufacturing the thus configured solid-state imaging device will be described below.

Firstly, in order to form the element isolation portions 2 and 2A, the semiconductor substrate 10 is grooved by etching to form grooves. Then, in order to form the deep-portion isolation implantation layers 1, boron $B^{+11}$ is implanted from a bottom of the formed grooves under conditions of an acceleration voltage between 300 keV and 1 MeV, inclusive, and a dose between $5 \times 10^{11}$ cm$^{-2}$ and $1\times10^{12}$ cm$^{-2}$, inclusive. As a result, the deep-portion isolation implantation layers 1 having an impurity density of $1\times10^{16}$ cm$^{-3}$ or more can be formed under the grooves.

Next, in order to form the element isolation portions 2 and 2A, the grooves are filled with SiO$_2$ in accordance with a CVD method. Thereafter, the photodiode 3 and the transfer transistor 4 are formed in the semiconductor substrate 10.

In such a solid-state imaging device 100, when the photodiode 3 converts incident light into a signal charge so as to let the storage photodiode layer 6 store the signal charge, the deep-portion isolation implantation layers 1 prevent the flow of the signal charge stored in the storage photodiode layer 6 into the transfer transistor 4 and the adjacent photodiode 3.

Since the flow of the signal charge stored in the storage photodiode layer 6 into the transfer transistor 4 is prevented, a saturation signal charge of the photodiode 3 increases. In addition, since the flow of the signal charge stored in the storage photodiode layer 6 into the adjacent photodiode 3 is prevented, color mixture can be suppressed, so that a solid-state imaging device with a favorable color reproducibility can be obtained.

Furthermore, a generated charge 79 that has been converted photoelectrically at a deep portion of the semiconductor substrate 10 also is reflected from the deep-portion isolation implantation layers 1, and therefore the flow of this charge into the adjacent transfer transistor 4 can be prevented. As a result, the sensitivity of the solid-state imaging device 100 is improved.

Note here that the deep-portion isolation implantation layers 1 may be formed under all of the element isolation portions formed in the solid-state imaging device, in addition to under the element isolation portions around the photodiode 3.

The present invention is especially effective for the application to an nMOS sensor in which a solid-state imaging device is configured with nMOS transistors only, because such sensor has only one type of element isolation portion.

As stated above, according to this embodiment, in order to prevent the flow of a charge from the photodiode 3 to the MOS transistor 4, the deep-portion isolation implantation layer 1 is formed under the element isolation portion 2. Thus, the flow of the charge from the photodiode 3 to the MOS transistor 4 can be prevented. As a result, a solid-state imaging device with a favorable sensitivity can be obtained.

Figure 4:
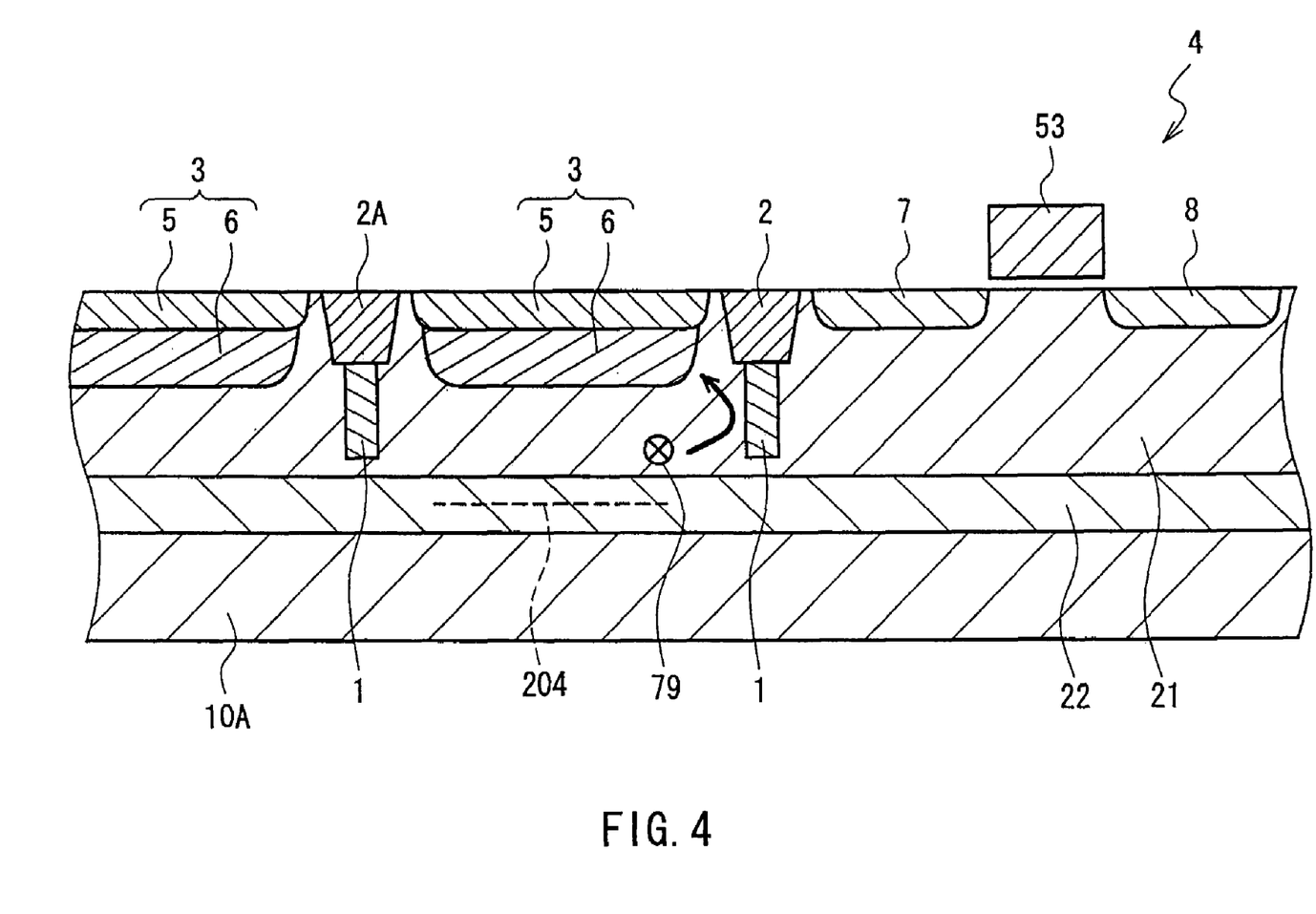
FIG. 4 is a cross-sectional view taken along a line AA shown in FIG. 2 for explaining a configuration of a photodiode and a MOS transistor that are provided in another solid-state imaging device according to this embodiment.

FIG. 4 is a cross-sectional view for explaining a configuration of a photodiode 3 and a transfer transistor 4 that are provided in another solid-state imaging device according to this embodiment. The same reference numerals are assigned to the elements having the same configurations as those of the elements described with reference to FIG. 3, and therefore detailed explanations for these elements will be omitted.

In the semiconductor substrate 10A, a first p-type well 21 and a second p-type well 22 are provided. The first p-type well 21 is formed so as to enclose the photodiode 3, element isolation portions 2 and 2A and side faces and a bottom face of a deep-portion isolation implantation layer 1. The second p-type well 22 is formed under the first p-type well 21 and has an impurity density higher than an impurity density of the first p-type well 21.

An impurity density of the n-type semiconductor substrate 10A is set at $1\times10^{14}$ cm$^{-3}$. The impurity density of the first p-type well 21 is set at $1\times10^{15}$ cm$^{-3}$ and the impurity density of the second p-type well 22 is set at $3\times10^{15}$ cm$^{-3}$ or more. An impurity density of the deep-portion isolation implantation layer 1 is set at $1\times10^{16}$ cm$^{-3}$ or more. In this way, the impurity density of the deep-portion isolation implantation layer 1 is set larger than the impurity density of the second p-type well 22. The impurity density of the second p-type well 22 is set sufficiently higher than the impurity density of the first p-type well 21.

The first p-type well 21 is formed at up to a position of about 2.6 μm in depth from a surface of the semiconductor substrate 10A. The second p-type well 22 is formed at a position between about 2.6 μm and about 3.0 μm in depth.

When the impurity density of the second p-type well 22 is set sufficiently higher than the impurity density of the first p-type well 21, a divide 204 of a charge is formed at substantially a midpoint of the second p-type well 22. Therefore, the divide 204 is formed at a position deeper than the conventional divide described above with reference to FIG. 9. That is to say, a region for storing a signal charge that has been converted by the photodiode 3 is widened. The provision of a deep-portion isolation implantation layer 1 in such a configuration allows the flow of a charge from the photodiode 3 to the transfer transistor 4 to be prevented. Thus, a saturation signal charge of the photodiode 3 increases. As compared with the configuration described above with reference to FIG. 3, color mixture resulting from a generated charge 79 that has been converted photoelectrically at a deeper portion of the semiconductor substrate 10A further can be suppressed, so that a solid-state imaging device with a favorable color reproducibility can be realized.

The following describes more details of a discharging method shown in FIG. 4. This discharging method is different from the above-described discharging method shown in FIG. 9.

Since the impurity density of the second p-type well 22 is higher than the impurity density of the n-type semiconductor substrate 10A, a depletion layer extending from the n-type semiconductor substrate 10A toward a side of the photodiode 3 stops at the second p-type well 22. Therefore, the depletion layer cannot contact with a depletion layer extending from the photodiode 3 side toward a side of the n-type semiconductor substrate 10A.

That is to say, a charge (electron) overflowing the photodiode 3 is emitted to a p-type neutral region in which a lot of holes are present. The electron emitted from the photodiode 3 to the p-type neutral region has a long life and never recombine with a hole, so as to move at random like the trace of a drunken gait in a region where an electric field does not act.

Although a portion of the electrons emitted from the photodiode 3 to the p-type neutral region flows into the n-type substrate, another portion of the emitted electrons flows into the adjacent photodiode 3 or the transfer transistor 4. Whether the electrons flow into the photodiode 3 adjacent to the n-type substrate or into the transfer transistor 4 is a matter of probability. Such a discharging method is called a bipolar action mode.

In order to lower the probability of the flow into the adjacent photodiode 3 or the transfer transistor 4, the deep-portion isolation implantation layer 1 is required. In order to make this probability small, it is desirable that the impurity density of the deep-portion isolation implantation layer 1 is larger than the impurity density of the second p-type well 22. In addition, it is desirable that the deep-portion isolation implantation layer 1 contacts with the second p-type well 22.

Figure 5:
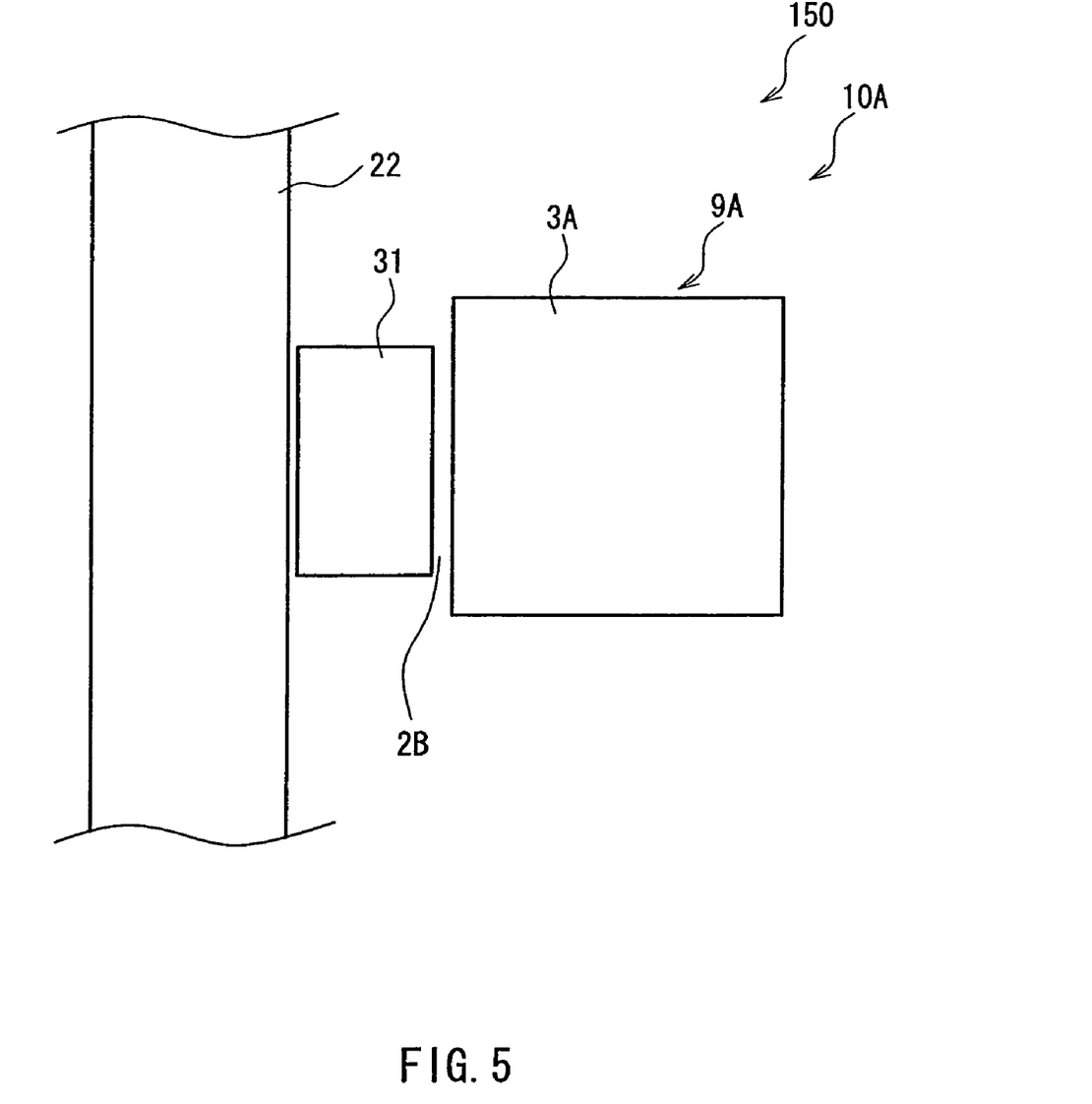
FIG. 5 is a plan view for explaining a configuration of an interline transfer CCD image sensor according to this embodiment.

The configuration described above with reference to FIGS. 1 to 4 can be applied to an interline transfer CCD image sensor. FIG. 5 is a plan view for explaining a configuration of an interline transfer CCD image sensor 150 according to this embodiment.

The interline transfer CCD image sensor 150 includes a plurality of pixel cells 9A that are arranged in a matrix form on a semiconductor substrate 10A. Each of the plurality of pixel cells 9A includes a photodiode 3A, a transfer gate 31, an element isolation portion 2B and a vertical transfer CCD 22. The photodiode 3A converts incident light into a signal charge and stores the signal charge, and the transfer gate 31 is provided for reading out the signal charge stored in the photodiode 3A. The element isolation portion 2B is formed of a STI (Shallow Trench Isolation) that is a grooved portion of the semiconductor substrate 10A so that the photodiode 3A and the transfer gate 31 are isolated from each other. The vertical transfer CCDs 22 are arranged at predetermined intervals and along a vertical direction so as to be adjacent to the respective pixel cells 9A that are arranged along the vertical direction, the vertical transfer CCDs 22 being provided for transferring the signal charge read out from the photodiode 3A by the transfer gate 31 along the vertical direction.

Under the element isolation portion 2B, a deep-portion isolation implantation layer is formed for preventing the flow of a charge from the photodiode 3A to the transfer gate 31.

In this way, with the configuration similar to the above-described one, the deep-portion isolation implantation layer is formed under the element isolation portion 2B, whereby an interline transfer CCD image sensor providing the effects similar to those described with reference to FIGS. 1 to 4 can be obtained.

As stated above, according to the present invention, a high-performance solid-state imaging device, a method for manufacturing the same and an interline transfer CCD image sensor can be provided.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a solid-state imaging device comprising a plurality of pixel cells arranged in a matrix form on a semiconductor substrate;
   wherein each of the plurality of pixel cells comprises: a photodiode; at least one MOS transistor that is provided for reading out the signal charge stored in the photodiode; a trench isolation portion that isolates the photodiode and the MOS transistor from each other; and a deep-portion isolation implantation layer that is formed under the trench isolation portion, and
   wherein the semiconductor substrate comprises: a n-type substrate; a first p-type well that is formed so as to enclose the photodiode, the trench isolation portion and side faces and a bottom face of the deep-portion isolation implantation layer; and a second p-type well that is formed between the n-type substrate and the first p-type well and has an impurity density higher than an impurity density of the first p-type well,
   the method comprising the steps of:
   grooving the semiconductor substrate so as to form a groove for the formation of the trench isolation portion;
   implanting an impurity from a bottom of the groove so as to form the deep-portion isolation implantation layer so that a side face and a bottom face thereof are enclosed within the first p-type well;
   forming the trench isolation portion in the groove after the impurity implantation step; and
   forming the photodiode and the at least one MOS transistor after the trench isolation portion formation step.

2. The method for manufacturing a solid-state device according to claim 1,
   wherein the MOS transistor comprises a source and a drain that are formed in the first p-type well, and
   an impurity having a conductivity type opposite to a conductivity type of the source and the drain of the MOS transistor is implanted into the deep-portion isolation implantation layer.

3. The method for manufacturing a solid-state imaging device according to claim 1, wherein the trench isolation portion is formed so that the photodiode is isolated from another photodiode included in a pixel cell adjacent to the pixel cell including the photodiode.

4. The method for manufacturing a solid-state imaging device according to claim 1, wherein the deep-portion isolation implantation layer is formed to a position deeper than the photodiode.

5. The method for manufacturing a solid-state imaging device according to claim 1, wherein the deep-portion isolation implantation layer is formed at a position from about 0.3 μm to about 1.0 μm in depth from a surface of the semiconductor substrate.

6. The method for manufacturing a solid-state imaging device according to claim 1, wherein the at least one MOS transistor is at least one n-type MOS transistor.

7. The method for manufacturing a solid-state imaging device according to claim 1, wherein the deep-portion isolation implantation layer is formed so as to contact with the second p-type well.

8. The method for manufacturing a solid-state imaging device according to claim 1, wherein an impurity density of the deep-portion isolation implantation layer is larger than the impurity density of the second p-type well.

9. The method for manufacturing a solid-state imaging device according to claim 1, further comprising a driving unit that is provided for driving the plurality of pixel cells, wherein the driving unit comprises:
   a vertical driving circuit for driving the plurality of pixel cells along a row direction; and
   a horizontal driving circuit for driving the plurality of pixel cells along a column direction.

10. A method for manufacturing a solid-state imaging device comprising a plurality of pixel cells arranged in a matrix form on a semiconductor substrate;
    wherein each of the plurality of pixel cells comprises: a photodiode; at least one MOS transistor that is provided for reading out the signal charge stored in the photodiode; a trench isolation portion that isolates the photodiode and another photodiode included in a pixel cell adjacent the pixel cell including the photodiode from each other; and a deep-portion isolation implantation layer that is formed under the trench isolation portion, and
    wherein the semiconductor substrate comprises: a n-type substrate; a first p-type well that is formed so as to enclose the photodiode, the trench isolation portion and side faces and a bottom face of the deep-portion isolation implantation layer, and a second p-type well that is formed between the n-type substrate and the first p-type well and has an impurity density higher than an impurity density of the first p-type well,
    the method comprising the steps of:

grooving the semiconductor substrate so as to form a groove for the formation of the trench isolation portion;

implanting an impurity form a bottom of the groove so as to form the deep-portion isolation implantation layer so that a side face and a bottom face thereof are enclosed within the first p-type well;

forming the trench isolation portion in the groove after the impurity implantation step; and forming the photodiode and the at least one MOS transistor after the trench isolation portion formation step.

11. A method for manufacturing an interline transfer CCD image sensor comprising a plurality of pixel cells arranged in a matrix form on a semiconductor substrate;

wherein each of the plurality of pixel cells comprises: a photodiode that converts incident light into a signal charge and stores the signal charge; a transfer gate that is provided for reading out the signal charge stored in the photodiode; vertical transfer CCDs that are arranged at predetermined intervals and along a vertical direction so as to be adjacent to the representative pixel cells that are arranged along a column direction, the vertical transfer CCDs being provided for transferring the signal charge read out from the photodiode by the transfer gate along the vertical direction; a trench isolation portion that isolates the photodiode and the vertical transfer CCDs from each other; and a deep-portion isolation implantation layer that is formed under the trench isolation portion, and wherein the semiconductor substrate comprises: a n-type substrate; a first p-type well that is formed so as to enclose the photodiode, the trench isolation portion and side faces and a bottom face of the deep-portion isolation implantation layer; and a second p-type well that is formed between the n-type substrate and the first p-type well and has an impurity density higher than an impurity density of the first p-type well, the method comprising the steps of:

grooving the semiconductor substrate so as to form a groove for the formation of the trench isolation portion;

implanting an impurity from a bottom of the groove so as to form the deep-portion isolation implantation layer so that a side face and a bottom face thereof are enclosed within the first p-type well;

forming the trench isolation portion in the groove after the impurity implantation step; and forming the photodiode and the at least one MOS transistor after the trench isolation portion formation step.

12. The method for manufacturing an interline transfer CCD image sensor according to claim 11, wherein the deep-portion isolation implantation layer is formed so as to connect with the second p-type well.

13. The method for manufacturing an interline transfer CCD image sensor according to claim 11, wherein an impurity density of the deep-portion isolation implantation layer is larger than the impurity density of the second p-type well.

* * * * *